United States Patent
Tseng et al.

(10) Patent No.: US 8,766,357 B2
(45) Date of Patent: Jul. 1, 2014

(54) APPARATUS AND METHOD FOR HIGH VOLTAGE MOS TRANSISTOR

(75) Inventors: Chao-Wei Tseng, Jhonghe (TW); Kun-Ming Huang, Taipei (TW); Cheng-Chi Chuang, Zhonghe (TW); Fu-Hsiung Yang, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 85 days.

(21) Appl. No.: 13/410,135

(22) Filed: Mar. 1, 2012

(65) Prior Publication Data

US 2013/0228873 A1 Sep. 5, 2013

(51) Int. Cl.
*H01L 29/66* (2006.01)

(52) U.S. Cl.
USPC .................................. 257/343; 257/E29.256

(58) Field of Classification Search
USPC ............ 257/343, E29.256, E29.258, E29.261
See application file for complete search history.

(56) References Cited

U.S. PATENT DOCUMENTS

| 5,382,826 | A | 1/1995 | Mojaradi et al. | |
| 6,680,515 | B1 | 1/2004 | Hsing | |
| 6,803,302 | B2 * | 10/2004 | Pozder et al. | 438/612 |
| 2009/0001462 | A1 * | 1/2009 | Huang et al. | 257/343 |
| 2009/0039424 | A1 * | 2/2009 | Su et al. | 257/339 |
| 2011/0101453 | A1 * | 5/2011 | Lin et al. | 257/339 |
| 2013/0056825 | A1 * | 3/2013 | Chen et al. | 257/344 |

OTHER PUBLICATIONS

Koichi, E., et al., "A 500V 1A 1-Chip Inverter IC with a New Electric Field Reduction Structure," Proc. of the 6th Internat. Symposium on Power Semiconductor Devices & IC's, Davos, Switzerland, May 31-Jun. 2, 1994, 6 pages.

* cited by examiner

*Primary Examiner* — Matthew W Such
*Assistant Examiner* — Ali Naraghi
(74) *Attorney, Agent, or Firm* — Slater and Matsil, L.L.P.

(57) ABSTRACT

A high voltage MOS transistor comprises a first drain/source region formed over a substrate, a second drain/source region formed over the substrate and a first metal layer formed over the substrate. The first metal layer comprises a first conductor coupled to the first drain/source region through a first metal plug, a second conductor coupled to the second drain/source region through a second metal plug and a plurality of floating metal rings formed between the first conductor and the second conductor. The floating metal rings help to improve the breakdown voltage of the high voltage MOS transistor.

18 Claims, 8 Drawing Sheets

APPARATUS AND METHOD FOR HIGH VOLTAGE MOS TRANSISTOR

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As semiconductor devices are scaled down, new techniques are needed to maintain the electronic components' performance from one generation to the next. For example, high breakdown voltage transistors are desirable for high power applications.

As semiconductor technologies evolve, metal oxide semiconductor (MOS) transistors have been widely used in today's integrated circuits. MOS transistors are voltage controlled device. When a control voltage is applied to the gate a MOS transistor and the control voltage is greater than the threshold of the MOS transistor, a conductive channel is established between the drain and the source of the MOS transistor. As a result, a current flows between the drain and the source of the MOS transistor. On the other hand, when the control voltage is less than the threshold of the MOS transistor, the MOS transistor is turned off accordingly.

MOS transistors may include two major categories. One is n-channel MOS transistors; the other is p-channel MOS transistors. According to the structure difference, MOS transistors can be further divided into three sub-categories, planar MOS transistors, lateral double diffused MOS transistors and vertical double diffused MOS transistors. In comparison with other MOS transistors, the lateral double diffused MOS transistors are capable of delivering more current per unit area while maintaining a high breakdown voltage. Lateral double diffused MOS transistors may be alternatively referred to as high voltage MOS transistors.

In order to improve the reliability of high voltage MOS transistors, a variety of qualification tests may be performed on a high voltage MOS transistor. For example, a high temperature reverse bias (HTRB) test is performed to accelerate failure mechanisms. It is done by applying about 80%-100% of the maximum voltage to which the high voltage MOS transistor is specified while stressing the high voltage MOS transistor at a temperature range from about 125 degrees to 200 degrees up to about 168 hours. Such a high temperature test helps to accelerate failure mechanisms so as to simulate a test conducted at a lower temperature for a greater length of time. A pressure cooker test (PCT) is another qualification test normally performed on a high voltage MOS transistor. It may be performed at 150 degrees and 2-atm pressure. The PCT helps to test the high voltage MOS transistor's package moisture resistance.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a high voltage metal oxide semiconductor (MOS) transistor with a plurality of floating metal rings. The embodiments of the disclosure may also be applied, however, to a variety of high voltage transistors.

Figure 1:
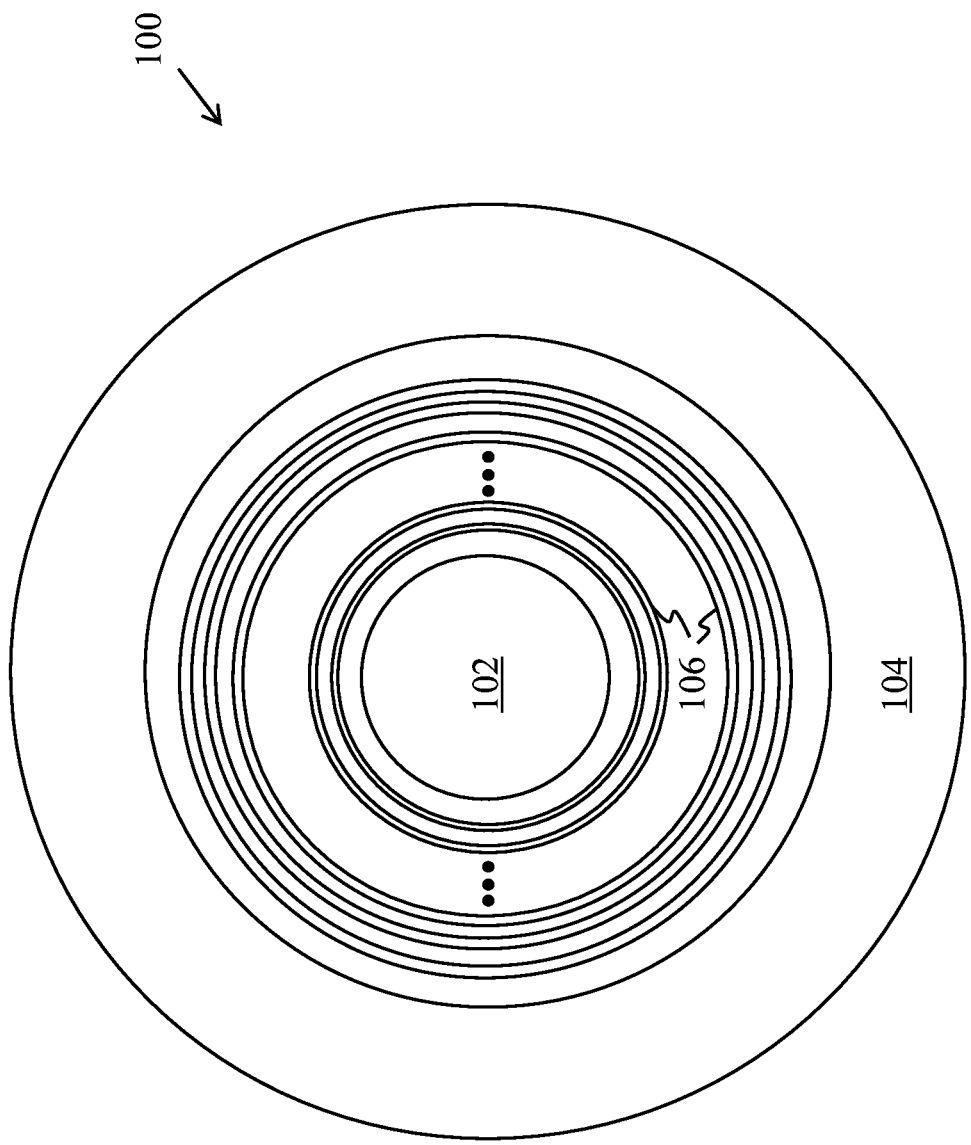
FIG. 1 illustrates a top view of a first metal layer of a high voltage MOS transistor in accordance with an embodiment.

FIG. 1 illustrates a top view of a first metal layer of a high voltage MOS transistor in accordance with an embodiment. For simplicity, only relevant elements and location relations are depicted in FIG. 1. In accordance with an embodiment, a first conductor 102 of the first metal layer 100 is coupled to a first drain/source region of the high voltage MOS transistor (not shown but illustrated in FIG. 3). A second conductor 104 of the first metal layer 100 is coupled to a second drain/source region of the high voltage MOS transistor (not shown but illustrated in FIG. 3).

As shown in FIG. 1, there may be a plurality of floating metal rings 106 formed between the first conductor 102 and the second conductor 104. Furthermore, as shown in FIG. 1, the floating metal rings 106 may be evenly spaced between the first conductor 102 and the second conductor 104. The floating metal rings 106 help to achieve a uniform electric field distribution between the first drain/source region (not shown but illustrated in FIG. 3) and the second drain/source region (not shown but illustrated in FIG. 3). As a result, the reliability performance of the high voltage MOS transistor may be improved. The detailed description of the floating metal rings 106 will be discussed below with respect to FIGS. 2-5.

It should be noted that while FIG. 1 illustrates the first conductor 102 is substantially circular in shape. It is within the scope and spirit of various embodiments for the first conductor 102 to comprise other shapes, such as, but no limited to oval, square, rectangular or an irregular shape. It will be appreciated that the shape of the first conductor 102 is a matter of choice of design. It should further be noted that the shape of floating metal rings 106 may change accordingly when the first conductor 102 is in other shapes.

Figure 2:
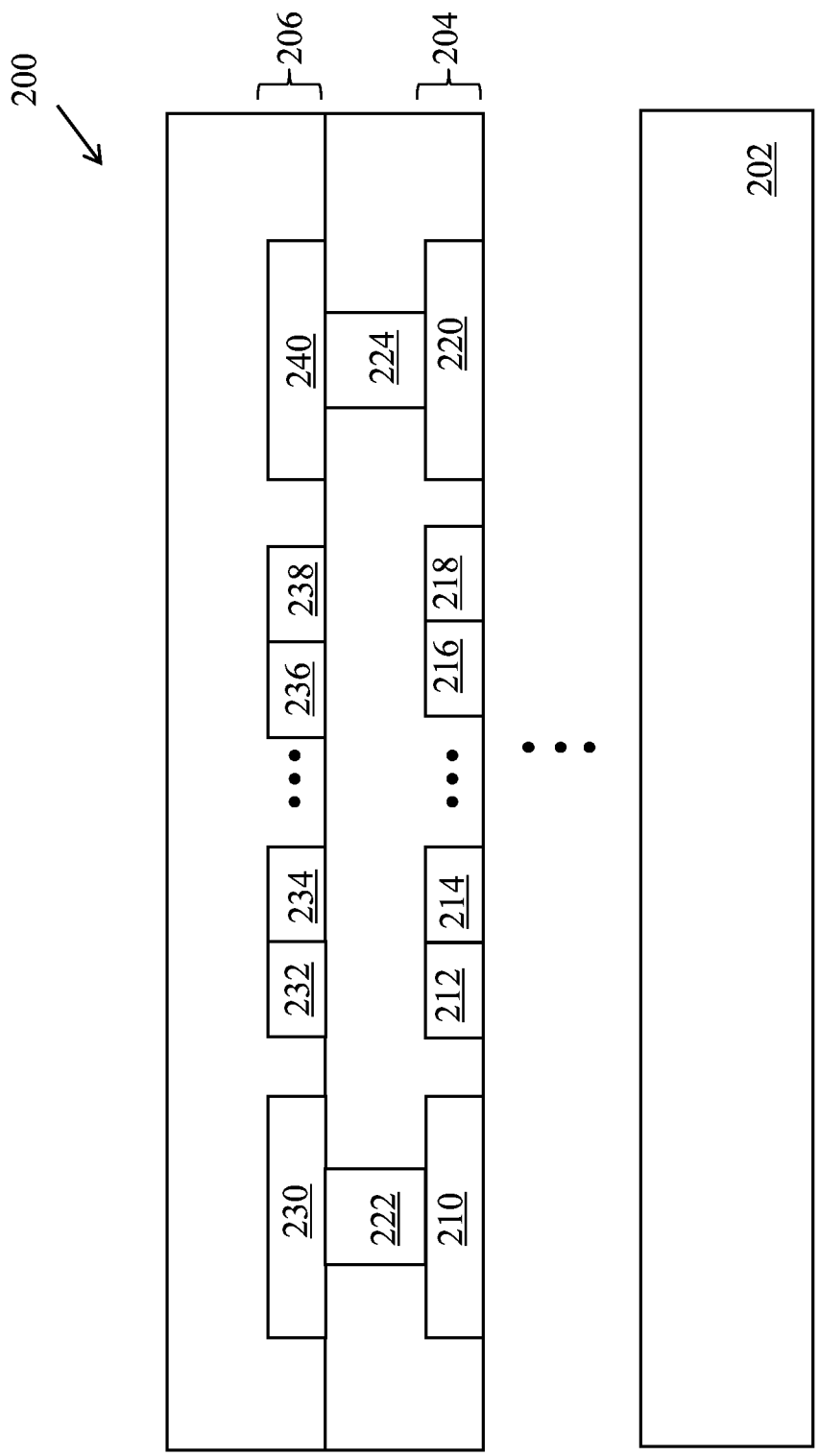
FIG. 2 illustrates a simplified cross-sectional view of a high voltage MOS transistor having floating metal rings.

FIG. 2 illustrates a simplified cross-sectional view of a high voltage MOS transistor having floating metal rings. The high voltage MOS transistor 200 may comprise two metal layers, namely a first metal layer 204 and a second metal layer 206. As shown in FIG. 2, both the first metal layer 204 and the second metal layer 206 are formed over a substrate 202. There may be a plurality of semiconductor layers or structures between the metal layer 204 and the substrate 202. For simplicity, only the first metal layer 204 and the second metal layer 206 are discussed herein. The detailed formation of an embodiment MOS transistor with floating metal rings will be described below with respect to FIG. 3.

As shown in FIG. 2, the first metal layer 204 may comprise a first conductor 210 and a second conductor 220. The first conductor 210 and the second conductor 220 may be further coupled to a first drain/source region and a second drain/source region of the high voltage MOS transistor 200 respectively (not shown). From the cross sectional view shown in FIG. 2, there may be a plurality of floating metal blocks (e.g., metal block 212) between the first conductor 210 and the second conductor 220. Likewise, the second metal layer 206 may comprise a third conductor 230 and a fourth conductor 240. Through metal plugs 222 and 224, the third conductor 230 and the fourth conductor 240 may be coupled to the first metal conductor 210 and the second metal conductor 220 respectively. Furthermore, there may be a plurality of floating metal blocks (e.g., metal block 232) between the third conductor 230 and the fourth conductor 240.

In a top view (e.g., FIG. 1), the floating metal blocks (e.g., metal block 212 or metal block 232) may be a plurality of floating metal rings as shown in FIG. 1. The floating metal rings shown in FIG. 1 help to improve the breakdown voltage of a high voltage MOS transistor. While the present invention is not limited to any particular theory of operation, it is believe during a variety of qualification tests such as PCT and HTRB, in order to improve water resistance, a silicon nitride layer may be employed to prevent moisture from penetrating the high voltage MOS transistor package. On the other hand, the HTRB test may lead to trapped ions. Such trapped ions cannot be neutralized because the silicon nitride layer is a good insulator to prevent the ions from being neutralized. As a result, the trapped ions become mobile ions, which may cause a degradation of the breakdown voltage of the high voltage MOS transistor. The floating metal rings help to achieve a uniform electric field between the source and the drain of the high voltage MOS transistor. Such a uniform electric field may help to prevent the mobile ions from interfering with the electrical characteristics of the high voltage MOS transistor. In sum, the uniform electric field generated by the floating metal rings helps to prevent the degradation of a high voltage MOS transistor.

It should be noted that while FIG. 2 illustrates that the metal blocks (e.g., metal block 232) of the second metal layer 206 are vertically aligned with their corresponding metal blocks (e.g., metal 212) of the first metal layer 204, the vertical alignment between the metal blocks of the second metal layer 206 and the metal blocks of the first metal layer 204 is merely an example, which should not unduly limit the scope of the claims. One of ordinary skill in the art would recognize many variations, alternatives, and modifications. For example, a metal block (e.g., metal block 232) of the second metal layer 206 may be located between two metal blocks (e.g., metal blocks 212 and 214) of the first metal layer 204. The detailed formation and location relations of the metal blocks will be described with respect to FIGS. 4 and 5.

Figure 3:
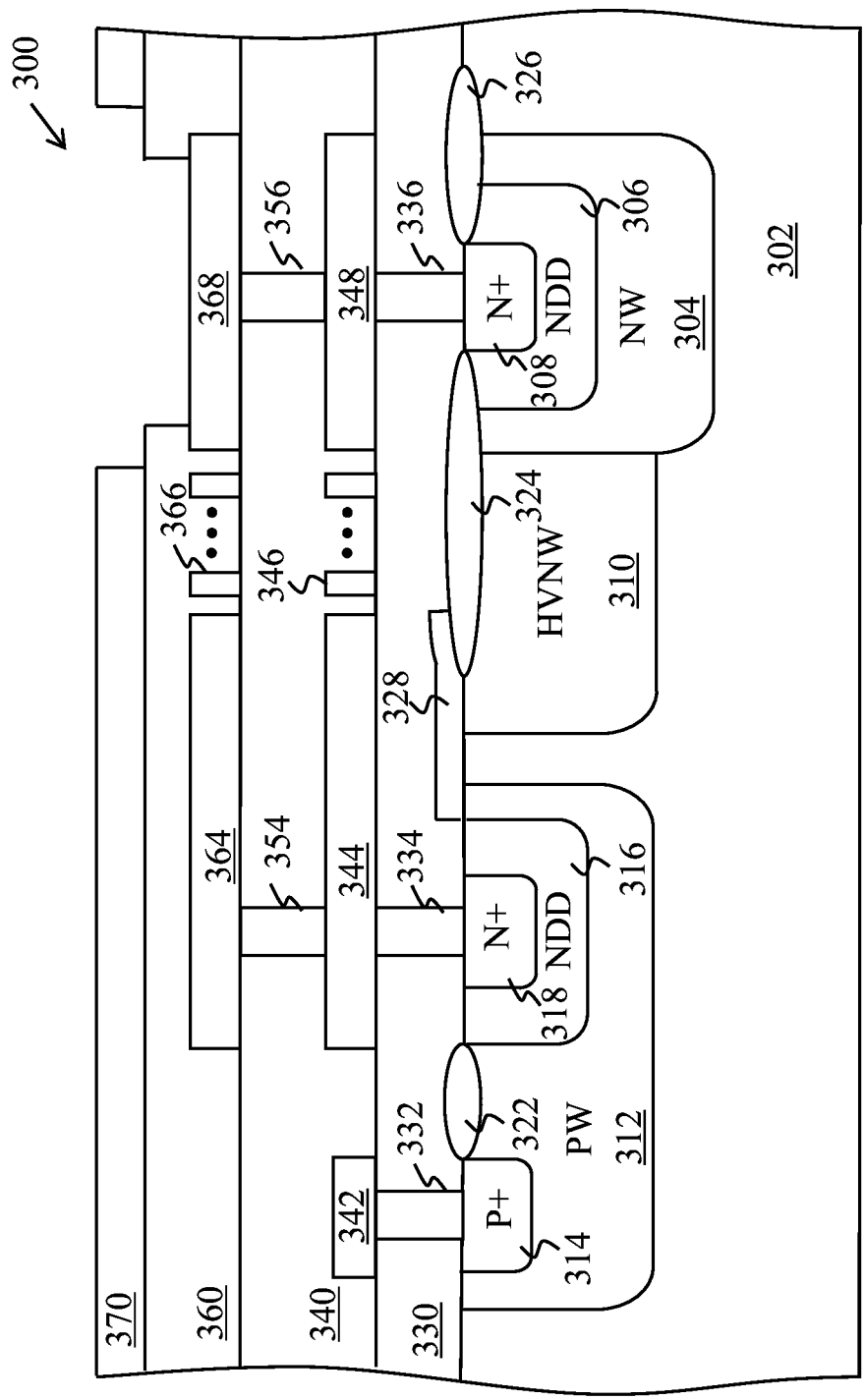
FIG. 3 illustrates a cross-sectional view of a high voltage MOS transistor with floating metal rings in accordance with an embodiment.

FIG. 3 illustrates a cross-sectional view of a high voltage MOS transistor with floating metal rings in accordance with an embodiment. The high voltage MOS transistor 300 includes a substrate 302. The substrate 302 may be formed of silicon, silicon germanium, silicon carbide or the like. The high voltage MOS transistor 300 may further comprise a p well 312, an n well 304 and a high voltage n well 310 formed over the substrate 302. As shown in FIG. 3, the high voltage n well 310 is adjacent to the n well 304. In particular, the high voltage n well 310 is formed between the p well 312 and the n well 304.

The n well region 304 is formed over the substrate 302. In accordance with an embodiment, the n well region 304 may be doped with an n-type dopant such as phosphorous to a doping density of about $10^{15}/cm^3$ to $10^{16}/cm^3$. It should further be noted that other n-type dopants such as arsenic, nitrogen, antimony, combination thereof, or the like, could alternatively be used.

The p well region 312 may be formed by implanting p-type doping materials such as boron, gallium, aluminum, indium, combinations thereof, or the like. In accordance with an embodiment, a p-type material such as boron may be implanted to a doping density of about $10^{15}/cm^3$ to $10^{16}/cm^3$. Alternatively, the p well region 312 can be formed by any suitable fabrication processes such as a diffusion process.

A first n-type diffused drain/source (NDD) region 306 is formed over the substrate 302 in the n well 304. Furthermore, a first n+ region 308 is formed in the first NDD region 306. In accordance with an embodiment, the first n+ region 308 functions as a drain of the high voltage MOS transistor 300. The drain region may be formed by implanting an n-type dopant such as phosphorous at a concentration of between about $10^{19}/cm^3$ and about $10^{20}/cm^3$. Throughout the description, the first n+ region 308 is alternatively referred to as the first drain/source region 308.

A second NDD region 316 is formed over the substrate 302 in the p well 312. Furthermore, a second n+ region 318 is formed in the second NDD region 316. In accordance with an embodiment, the second n+ region 318 may be a source of the high voltage MOS transistor 300. The source region may be formed by implanting an n-type dopant such as phosphorous at a concentration of between about $10^{19}/cm^3$ and about $10^{20}/cm^3$. Throughout the description, the second n+ region 318 is alternatively referred to as the second drain/source region 318. As shown in FIG. 3, the source region is formed adjacent to a gate 328 on the opposite side from the drain (the first n+ region 308).

A p+ region 314 is formed adjacent to a field oxide region on the opposite side from the second n+ region 318 in the p well region 312. The p+ region 314 may be formed by implanting a p-type dopant such as boron at a concentration of between about $10^{19}/cm^3$ and about $10^{20}/cm^3$. The p+ region 314 may contact the p-type body. In order to eliminate the body effect, the p+ region 314 may be coupled to the source 318 directly through a source contact (not shown).

A gate 328 is formed over the substrate 302. The gate 328 may further comprise two sub-layers, namely a gate dielectric layer and a gate conductor layer (not shown separately). As shown in FIG. 3, the gate dielectric layer is formed over the substrate. In particular, one end of the gate dielectric layer touches the edge of the second NDD region 316 and the other end of the gate dielectric layer partially covers a second FOX region 324. The gate dielectric layer may be formed of silicon oxide, silicon oxynitride, hafnium oxide, zirconium oxide or the like. The gate conductor layer is formed on the first gate dielectric layer. The gate conductor layer may be formed of polysilicon, polysilicon germanium, nickel silicide or other metal, metal alloy materials.

A variety of field oxide (FOX) regions are formed to isolate active regions. A first FOX region 322 is disposed between edges of the p+ region 314 and the second NDD region 316. A second FOX region 324 is formed between the first drain/source region 308 and the gate 328. In particular, at one end of the second FOX region 324, the gate 328 partially covers the second FOX region 324. At the other end of the second FOX region 324, the second FOX region 324 touches a first edge of the first n+ region 308. A third FOX region 326 is disposed next to a second edge of the first n+ region 308. One advantageous feature of having FOX regions between active regions is that the FOX regions help to reduce the electric field density so as to improve the breakdown voltage of the high voltage MOS transistor 300.

As shown in FIG. 3, an inter-layer dielectric layer 330 is deposited over the substrate 302. The inter-layer dielectric layer 330 is formed of silicon oxide, although other materials such as silicon nitride doped silicate glass, high-k materials, combinations of these, or the like, may alternatively be utilized. Metal plugs 332, 334, 336 are formed on the p+ region 314, the second n+ region 318 and the first n+ region 308 respectively. Metal conductors 342, 344 and 348 are formed on the metal plugs 332, 334 and 336 respectively. In addition, a plurality of metal blocks (e.g., metal block 346) are formed between the metal conductor 344 and the metal conductor 348. An inter-metal dielectric layer 340 is formed on the metal conductors as well as metal blocks, and metal plugs 354 and 356 may be formed on the metal conductors 344 and 348 respectively. Alternatively, the metal conductors 344 and 348 could be formed in recesses in recesses in inter-metal dielectric layer 340 using a damascene process.

Likewise, Metal conductors 364 and 368 are formed on the metal plugs 322, 334 and 336 respectively. In addition, a plurality of metal blocks (e.g., metal block 366) are formed between the metal conductor 364 and the metal conductor 368. A passivation layer is formed on the metal conductor 364 as well as the metal blocks (e.g., metal block 366). The passivation layer may be divided into two portions. The first passivation layer 360 is an oxide layer. The second passivation layer 370 may be a polyimide layer.

Figure 4:
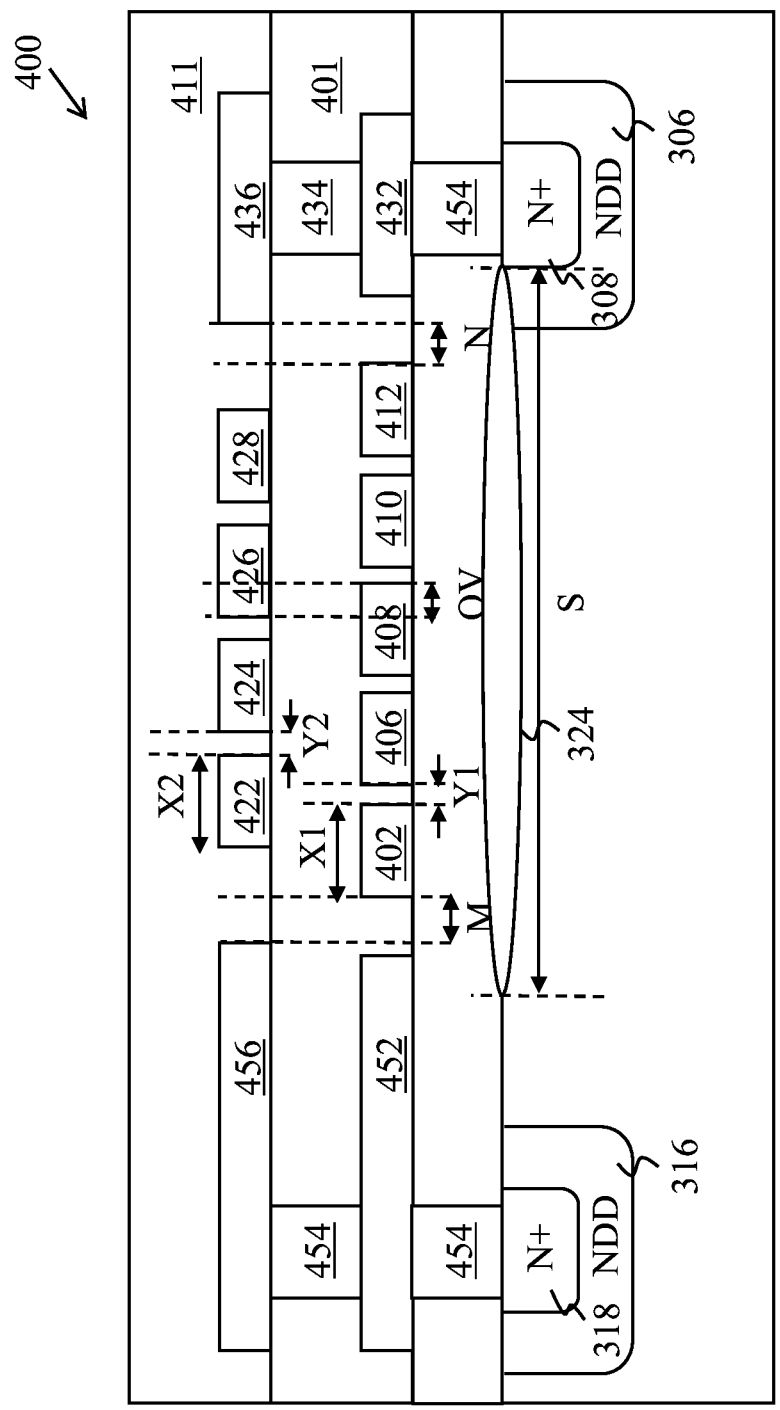
FIG. 4 illustrates a cross sectional view of floating metal rings in a high voltage MOS transistor having two metal layers in accordance with an embodiment.

FIG. 4 illustrates a cross sectional view of floating metal rings in a high voltage MOS transistor having two metal layers in accordance with an embodiment. In FIG. 4, only relevant structures of the high voltage MOS transistor 300 are shown. In particular, the second FOX region 324, the first n+ region 308, the second n+ region 318, the first NDD region 306, the second NDD region 316 are shown. In addition, the distance between two adjacent floating metal rings in the first metal layer 401 is illustrated and defined as Y1. Likewise, the distance between two adjacent floating metal rings in the second metal layer 411 is illustrated and defined as Y2. The lengths of the floating metal rings in the first metal layer and the second metal layer are defined as X1 and X2 respectively.

In order to better illustrate the physical characteristics of the floating metal rings, three other relevant parameters are specified. The length of the second FOX region 324 is defined as S. The horizontal distance between the left edge of the first floating ring 402 and the right edge of the first conductor 456 of the second metal layer 411 is defined as M. Likewise, the horizontal distance between the right edge of the fifth floating ring 412 and the left edge of the second conductor 436 of the second metal layer 411 is defined as N. Lastly, as shown in FIG. 4, the overlap between a floating metal ring (e.g., 426) in the second metal layer and a corresponding floating metal ring (e.g., 408) in the first metal layer is defined as OV.

In accordance with an embodiment, the length of a floating metal ring in the second metal layer (e.g., X2) is approximately equal to the length of a floating metal ring in the first metal layer (e.g., X1). In particular, the lengths X1 and X2 can be defined as follows:

$$X1=X2=m \cdot M2_t$$

where $M2_T$ is the thickness of the conductor in the second metal layer. In accordance with an embodiment, $M2_T$ is about 8000 Å and m is in a range from about 1.1 to about 1.6.

In accordance with another embodiment, the distance Y2 in the second metal layer is approximately equal to the distance Y1 in the first metal layer. In particular, the distances Y1 and Y2 can be defined as follows:

$$Y1=Y2=n \cdot M2_T$$

where $M2_T$ is the thickness of the conductor in the second metal layer. In accordance with an embodiment, $M2_T$ is about 8000 Å and n is in a range from about 1.0 to about 1.5.

In accordance with yet another embodiment, the overlap between a floating metal ring in the second metal layer and a corresponding floating metal ring in the first metal layer is in a range from about 0 to about one fourth of the length of a floating metal ring (e.g., X1 or X2). OV can be further limited by the following equations:

$$X2=Y1+2 \cdot OV$$

$$X1=Y2+2 \cdot OV$$

By solving the equations illustrated above, OV can be defined as follows:

$$OV = \frac{X2 - Y1}{2} \text{ or } OV = \frac{X1 - Y2}{2}$$

It should be noted that the equation illustrated above can be simplified into the following equation if X1=X2=X and Y1=Y2=Y.

$$OV = \frac{X - Y}{2}$$

In accordance with yet another embodiment, the physical characteristics of the floating metal rings shown in FIG. 4 may be further limited by the following equations. First, the overlap and the left side spacing M are limited by the minimum spacing of the floating metal rings of the second metal layer. In particular, the relationship can be defined as follows:

$$M+X-OV>Y2_m$$

where X is equal to X1 and X2. $Y2_m$ is the minimum spacing between two adjacent floating metal rings in the second metal layer. In addition, M is greater than one half of X. Furthermore, N is equal to the minimum spacing of the floating metal rings in the first metal layer plus 0.4 um.

In accordance with an embodiment, the total number of the floating metal rings in the second metal layer may be equal to the total number of the floating metal rings in the first metal layer minus two. In particular, the number of the floating metal rings in the second metal layer and the number of the floating metal rings in the first metal layer can be defined as follows:

$$M1 = \frac{P \cdot S - N - M + Y}{X + Y} + 2$$

$$M2 = \frac{P \cdot S - N - M + Y}{X + Y}$$

where Y is equal to Y1 and Y2. P is in a range from ½ to ⅓. In accordance with an embodiment, when Y1 and Y2 are equal to 0.8 um; X1 and X2 are equal to 0.9 um; S is equal to 130 um; P is selected in a range from ½ to ⅓, the total number of the floating metal rings in the first metal layer is in range from 32 to 42. Likewise, the total number of the floating metal rings in the second metal layer is in range from 30 to 40.

One skilled in the art will recognize that FIG. 4 illustrates an ideal profile as doped. The physical parameters (e.g., S) may slightly vary after subsequent processes. The physical parameters shown in FIG. 4 are used to illustrate the inventive aspects of the various embodiments. The present invention is not limited to any particular physical parameter.

Figure 5:
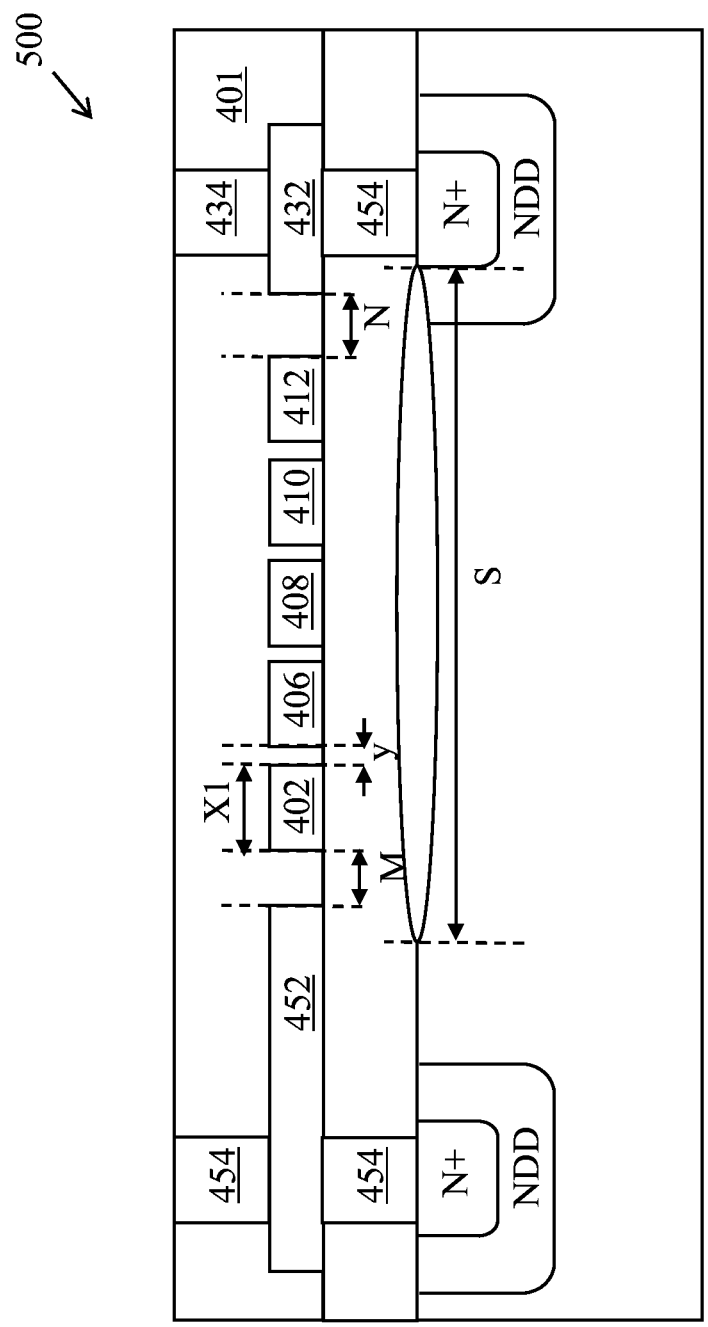
FIG. 5 illustrates a cross sectional view of floating metal rings in a high voltage MOS transistor having a single metal layer in accordance with an embodiment.

FIG. 5 illustrates a cross sectional view of floating metal rings in a high voltage MOS transistor having a single metal layer in accordance with an embodiment. The physical parameters shown in FIG. 5 are similar to those in FIG. 4 except that M is the horizontal distance between the left edge of the first floating ring 402 and the right edge of the first conductor 456 of the first metal layer 401 and N is the horizontal distance between the right edge of the fifth floating ring 412 and the left edge of the second conductor 432 of the first metal layer 401. The equations described above with respect to FIG. 4 are applicable to FIG. 5, and hence are not discussed herein to avoid unnecessary repetition.

Figure 6:
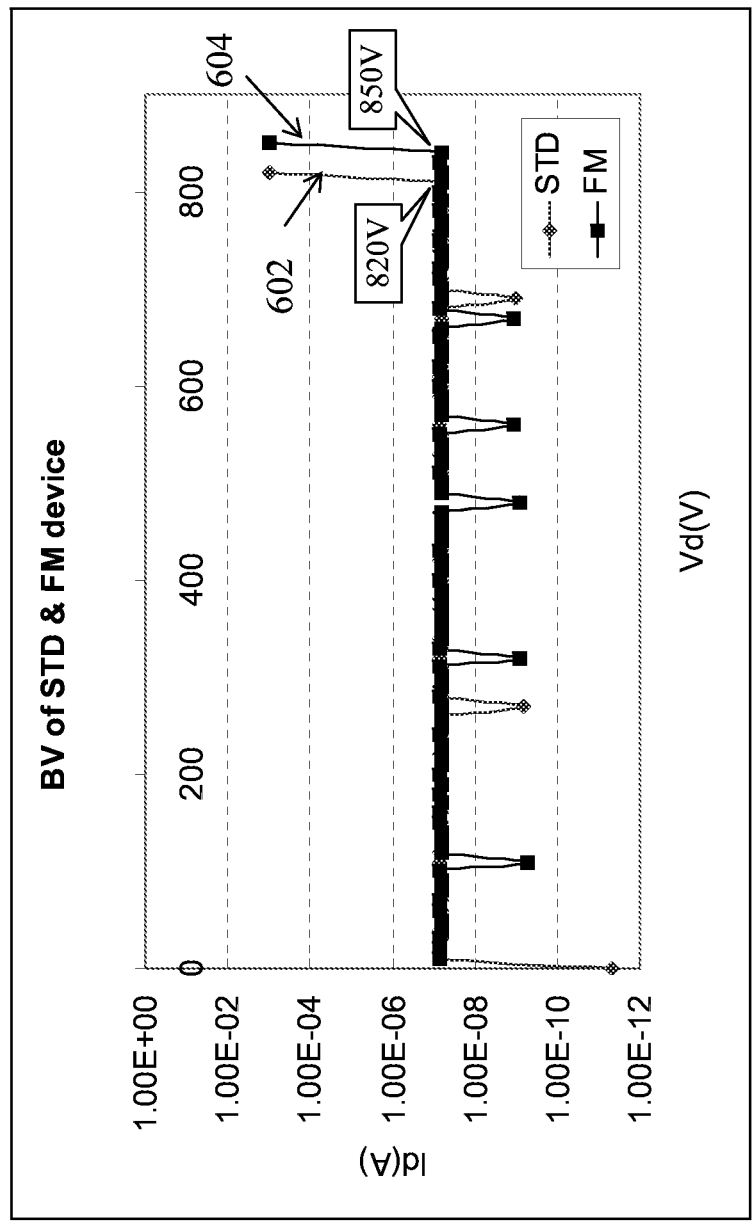
FIG. 6 illustrates two curves illustrating the performance difference between a traditional high voltage MOS transistor and a high voltage MOS transistor with floating metal rings.

FIG. 6 illustrates two curves illustrating the performance difference between a traditional high voltage MOS transistor and a high voltage MOS transistor with floating metal rings. The horizontal axis of FIG. 6 represents the breakdown voltage across a high voltage MOS transistor. The vertical axis of FIG. 6 represents the drain current of a high voltage MOS transistor. More particularly, the drain current is an indicator of the breakdown point of the high voltage MOS transistor. In accordance with an embodiment, a high voltage MOS transistor enters avalanche breakdown when the drain current is more than 1 uA.

A curve 602 and a curve 604 illustrate the breakdown voltage difference between a traditional high voltage MOS transistor and a high voltage MOS transistor with floating metal rings. As shown in FIG. 6, under the same testing conditions, a traditional MOS transistor has a breakdown voltage of 820V. By contrast, with the same drain current level, the high voltage MOS transistor with floating metal rings has a breakdown voltage of 850V. An advantageous feature of this embodiment is that floating metal rings help to improve the breakdown voltage of a high voltage MOS transistor.

Figure 7:
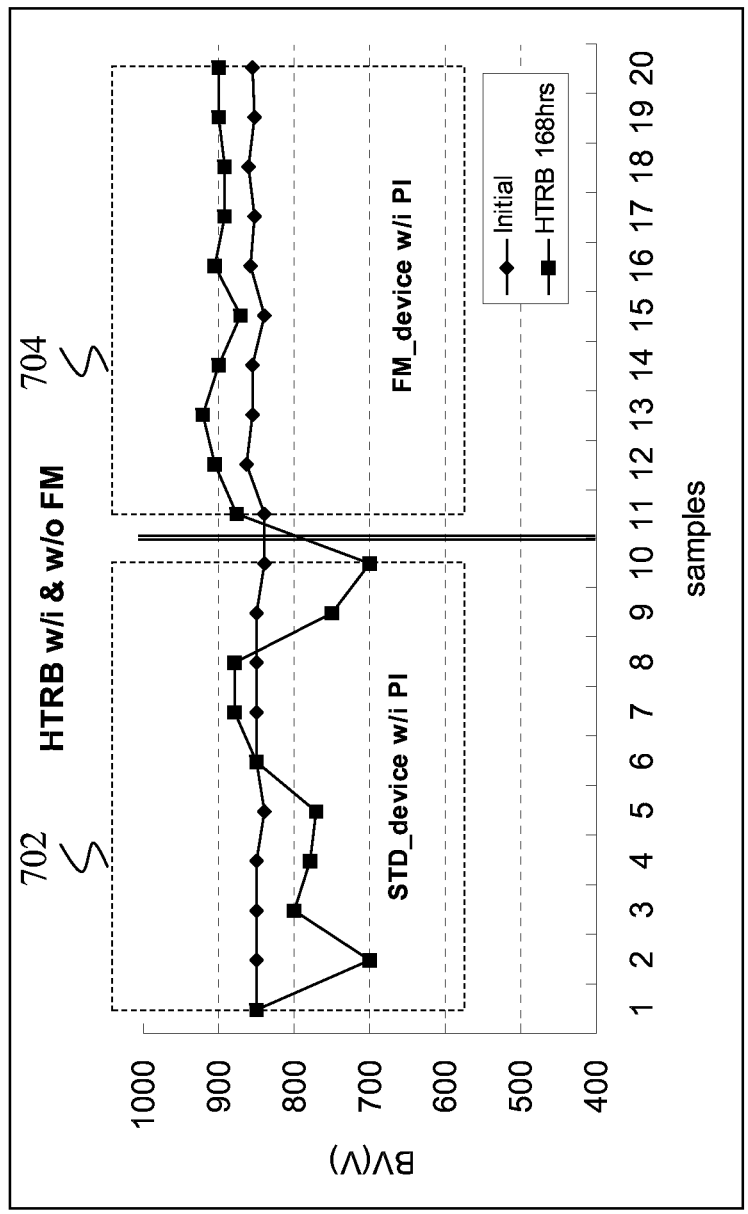
FIG. 7 illustrates two groups of curves illustrating the performance difference after a HTRB test between a traditional high voltage MOS transistor and a high voltage MOS transistor with floating metal rings.

FIG. 7 illustrates two groups of curves illustrating the performance difference after a HTRB test between a traditional high voltage MOS transistor and a high voltage MOS transistor with floating metal rings. The vertical axis of FIG. 7 represents the breakdown voltage of a high voltage MOS transistor. A first group of curves 702 include two curves representing the breakdown voltage characteristics of a traditional high voltage MOS transistor. The curve with diamond line markers represents the breakdown voltage before a HTRB test. The curve with square line markers represents the breakdown voltage after the HTRB test, which takes about 168 hours. As shown in FIG. 7, the breakdown voltage of a traditional MOS transistor degrades after a HTRB test. As shown in FIG. 7, the breakdown voltage of a traditional high voltage MOS transistor degrades to as low as about 700V for an 850V rating MOS transistor.

By contrast, with the same HTRB test, the high voltage MOS transistor with floating metal rings has a consistent breakdown voltage higher than 850V. A second group of curves 704 include two curves representing the breakdown voltage characteristics of a high voltage MOS transistor with floating metal rings. The curve with diamond line markers represents the breakdown voltage before a HTRB test. The curve with square line markers represents the breakdown voltage after a HTRB test. As shown in FIG. 7, there may be no degradation after a HTRB test. As shown in FIG. 7, the breakdown voltage of a high voltage MOS transistor with floating metal rings is slightly higher than that of the high voltage MOS transistor prior to a HTRB test. In accordance with an embodiment, the breakdown voltage of a high voltage MOS transistor with floating metal rings may be 50V higher than that of the high voltage MOS transistor prior to a HTRB test. An advantageous feature of this embodiment is that floating metal rings help to improve the breakdown voltage of a high voltage MOS transistor after a HTRB test.

Figure 8:
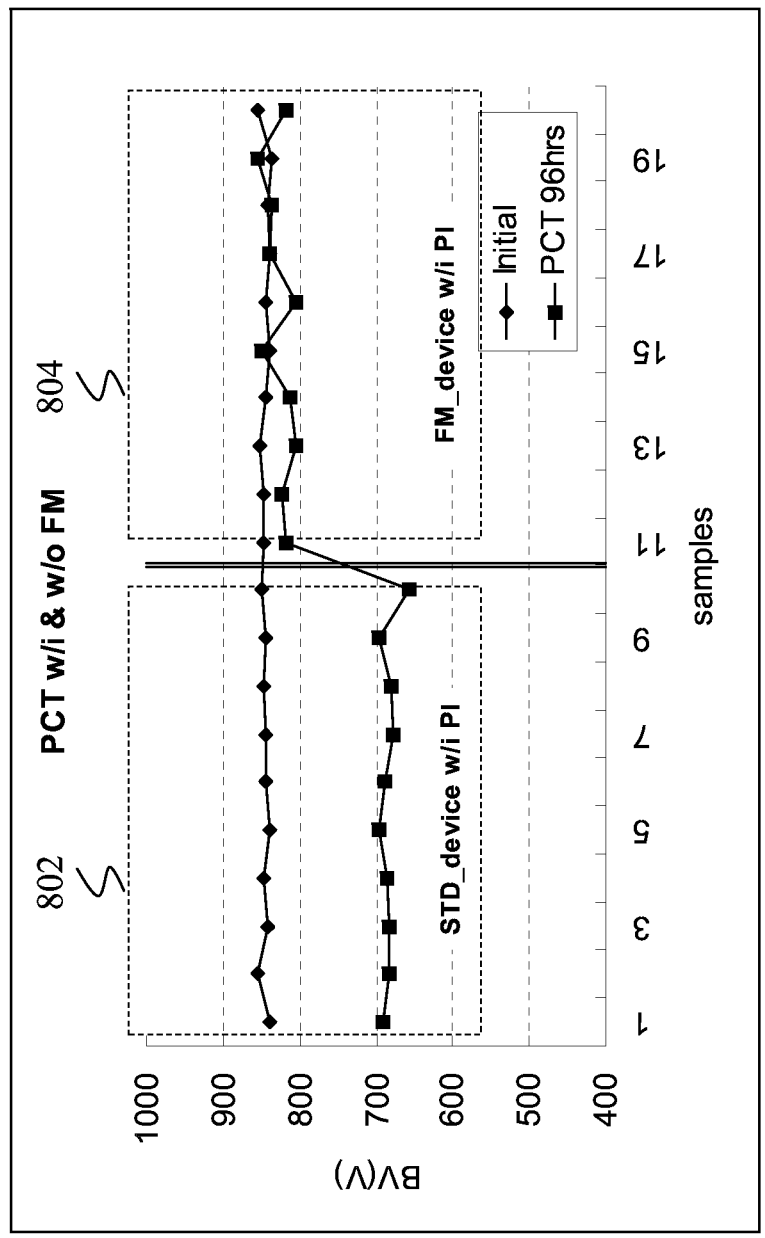
FIG. 8 illustrates two groups of curves illustrating the performance difference after a PCT test between a traditional high voltage MOS transistor and a high voltage MOS transistor with floating metal rings.

FIG. 8 illustrates two groups of curves illustrating the performance difference after a PCT test between a traditional high voltage MOS transistor and a high voltage MOS transistor with floating metal rings. The vertical axis of FIG. 8 represents the breakdown voltage of a high voltage MOS transistor. A first group of curves 802 include two curves representing the breakdown voltage characteristics of a traditional high voltage MOS transistor. The curve with diamond line markers represents the breakdown voltage before a PCT test. The curve with square line markers represents the breakdown voltage after a PCT test. As shown in FIG. 8, the breakdown voltage of a traditional MOS transistor degrades after a PCT test. As shown in FIG. 8, the breakdown voltage of a traditional high voltage MOS transistor degrades to as low as about 680V for an 850V rating MOS transistor.

By contrast, with the same PCT test, the high voltage MOS transistor with floating metal rings has a consistent breakdown voltage of 850V. A second group of curves 804 include two curves representing the breakdown voltage characteristics of a high voltage MOS transistor with floating metal rings. The curve with diamond line markers represents the breakdown voltage before a PCT test. The curve with square line markers represents the breakdown voltage after a PCT test. As shown in FIG. 8, there may be no significant degradation after a PCT test. As shown in FIG. 8, the breakdown voltage of a high voltage MOS transistor with floating metal rings is slightly less than that of the high voltage MOS transistor prior to a PCT test. An advantageous feature of this embodiment is that floating metal rings help to improve the breakdown voltage of a high voltage MOS transistor after a PCT test.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a first drain/source region formed over a substrate;
   a second drain/source region formed over the substrate;
   a first metal layer formed over the substrate comprising:
      a first conductor coupled to the first drain/source region through a first metal plug;
      a second conductor coupled to the second drain/source region through a second metal plug; and
      a plurality of first floating metal rings formed between the first conductor and the second conductor, wherein a cross sectional length of a first floating metal ring is approximately equal to a distance between two adjacent first floating metal rings;
   a plurality of second floating metal rings formed over the first floating metal rings, wherein a width of the second floating metal ring is equal to a width of the first floating metal ring;
   a third metal plug coupled between the first drain/source region and the first conductor;
   a fourth metal plug coupled between the second drain/source region and the second conductor;
   an oxide passivation layer, wherein the first floating metal rings are embedded in the oxide passivation layer; and
   a polyimide passivation layer formed over the oxide passivation layer, wherein the first floating metal rings are underneath the polyimide passivation layer.

2. The apparatus of claim 1, further comprising:
   a second metal layer formed over the first metal layer comprising:
      a third conductor coupled to the first conductor through a third metal plug;
      a fourth conductor coupled to the second conductor through a fourth metal plug; and
      the plurality of second floating metal rings formed between the third conductor and the fourth conductor, wherein an overlap between a second floating metal ring and a corresponding first floating metal ring is approximately equal to a half of a difference between the cross sectional length of the first floating metal ring and the distance between two adjacent first floating metal rings.

3. The apparatus of claim 2, wherein a first distance between two adjacent first floating metal rings is approximately equal to a second distance between two adjacent second floating metal rings.

4. The apparatus of claim 2, wherein a second floating metal ring is partially overlapped with a corresponding first floating metal ring.

5. The apparatus of claim 2, wherein:
   the third conductor has a circular shape from a top view;
   the second floating metal ring has a first ring shape from the top view; and
   the fourth conductor has a second ring shape from the top view.

6. The apparatus of claim 1, wherein:
   the first conductor has a circular shape from a top view;
   the first floating metal ring has a first ring shape from the top view; and
   the second conductor has a second ring shape from the top view.

7. The apparatus of claim 6, wherein the first conductor, the first floating metal ring and the second conductor are concentric.

8. The apparatus of claim 1, further comprising:
   a n well formed in the substrate;
   a p well formed in the substrate;
   a high voltage n well formed adjacent to the n well, wherein the high voltage n well is located between the p well and the n well;
   a first n-type diffused drain/source region formed in the n well;
   a second n-type diffused drain/source region formed in the p well;
   a first n+ region formed in the first n-type diffused drain/source region;
   a second n+ region formed in the second n-type diffused drain/source region;
   a first p+ region formed in the p well;
   a gate formed over the substrate;
   a first field oxide region formed between the first p+ region and the second n-type diffused drain/source region; and
   a second field oxide region formed between the first n+ region and the gate, wherein the gate partially covers the second field oxide region.

9. A device comprising:
   a drain region having a first conductivity type formed over a substrate;
   a source region having the first conductivity type formed over the substrate;
   a field oxide region formed between the drain region and the source region;
   a gate formed between the source region and the field oxide region, wherein the gate partially covers the field oxide region;
   a first metal layer formed over the substrate comprising:
      a first conductor coupled to the drain region through a first metal plug;
      a second conductor coupled to the source region through a second metal plug; and
      a plurality of first floating metal rings formed between the first conductor and the second conductor, wherein a cross sectional length of a first floating metal ring is approximately equal to a distance between two adjacent first floating metal rings;
   a plurality of second floating metal rings formed over the first floating metal rings, wherein a width of the second floating metal ring is equal to a width of the first floating metal ring;
   a third metal plug coupled between the drain region and the first conductor;
   a fourth metal plug coupled between the source region and the second conductor;
   an oxide passivation layer, wherein the first floating metal rings are embedded in the oxide passivation layer; and
   a polyimide passivation layer formed over the oxide passivation layer, wherein the first floating metal rings are underneath the polyimide passivation layer.

10. The device of claim 9, further comprising:
    a second metal layer formed over the first metal layer comprising:
       a third conductor coupled to the first conductor through a third metal plug;

a fourth conductor coupled to the second conductor through a fourth metal plug; and the plurality of second floating metal rings formed between the third conductor and the fourth conductor, wherein an overlap between a second floating metal ring and a corresponding first floating metal ring is approximately equal to a half of a difference between the cross sectional length of the first floating metal ring and the distance between two adjacent first floating metal rings.

11. The device of claim 9, further comprising:

a first well having the first conductivity type formed in the substrate;

a second well having a second conductivity type formed in the substrate;

a high voltage well having the first conductivity type formed adjacent to the first well, wherein the high voltage well is located between the second well and the first well;

a first diffused drain region with the first conductivity type formed in the first well;

a second diffused source region with the first conductivity type formed in the second well;

a first high doping density region with the first conductivity type formed in the first diffused drain region; and a second high doping density region with the first conductivity type formed in the second diffused source region.

12. The device of claim 11, wherein:

the first conductivity type is an n-type conductivity; and
the second conductivity type is a p-type conductivity.

13. The device of claim 11, wherein:

the first conductivity type is a p-type conductivity; and
the second conductivity type is an n-type conductivity.

14. The device of claim 9, where the first floating metal rings are formed over the field oxide region.

15. A method comprising:

providing a substrate with a second conductivity type;

forming a drain region in the substrate, wherein the drain region has a second conductivity type;

forming a source region in the substrate, wherein the source region has the second conductivity type;

formed a gate between the source region and the drain region;

forming a field oxide region between the drain region and the gate, wherein the gate partially covers the field oxide region;

forming a first metal layer over the substrate comprising a first conductor coupled to the drain region and a second conductor coupled to the source region, wherein the first conductor has a circular shape and the second conductor has a ring shape;

forming a plurality of first floating metal rings between the first conductor and the second conductor;

forming a plurality of second floating metal rings over the first floating metal rings, wherein a width of the second floating metal ring is equal to a width of the first floating metal ring;

forming a third metal plug coupled between the drain region and the first conductor;

forming a fourth metal plug coupled between the source region and the second conductor;

forming an oxide passivation layer, wherein the first floating metal rings are embedded in the oxide passivation layer; and forming a polyimide passivation layer formed over the oxide passivation layer, wherein the first floating metal rings are underneath the polyimide passivation layer.

16. The method of claim 15, further comprising:

forming a second metal layer over the first metal layer;

forming a third conductor coupled to the first conductor in the second metal layer;

forming a fourth conductor coupled to the second conductor in the second metal layer; and forming the plurality of second floating metal rings between the third conductor and the fourth conductor.

17. The method of claim 16, further comprising:

forming a first metal plug coupled between the third conductor and the first conductor; and forming a second metal plug coupled between the fourth conductor and the second conductor.

18. The method of claim 15, further comprising:

forming the first floating metal rings over the field oxide region.

* * * * *